(12) United States Patent
Firnkes et al.

(10) Patent No.: US 11,094,501 B2
(45) Date of Patent: Aug. 17, 2021

(54) SECONDARY CHARGED PARTICLE IMAGING SYSTEM

(71) Applicant: ICT Integrated Circuit Testing Gesellschaft für Halbleiterprüftechnik mbH, Heimstetten (DE)

(72) Inventors: Matthias Firnkes, Walpertskirchen (DE); Florian Lampersberger, Munich (DE); Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 8 days.

(21) Appl. No.: 16/688,985

(22) Filed: Nov. 19, 2019

(65) Prior Publication Data
US 2021/0151284 A1    May 20, 2021

(51) Int. Cl.
*H01J 37/244* (2006.01)
*H01J 37/10* (2006.01)

(52) U.S. Cl.
CPC ............ *H01J 37/244* (2013.01); *H01J 37/10* (2013.01); *H01J 2237/2448* (2013.01); *H01J 2237/24475* (2013.01)

(58) Field of Classification Search
CPC .. H01J 37/244; H01J 37/10; H01J 2237/2448; H01J 2237/24475
USPC .... 250/310, 307, 396 R, 282, 287, 288, 311, 250/396 ML, 290, 370.14, 390.02, 393, 250/394, 398, 399, 442.11
See application file for complete search history.

(56) References Cited

U.S. PATENT DOCUMENTS

| | | | | |
|---|---|---|---|---|
| 4,803,358 A | * | 2/1989 | Kato | H01J 37/20 250/307 |
| 5,422,486 A | * | 6/1995 | Herrmann | H01J 37/244 250/310 |
| 5,650,628 A | * | 7/1997 | Gordon | B82Y 10/00 250/396 R |
| 2007/0069150 A1 | * | 3/2007 | Frosien | H01J 37/153 250/396 ML |
| 2007/0200069 A1 | * | 8/2007 | Frosien | H01J 37/153 250/396 R |
| 2009/0189072 A1 | * | 7/2009 | Egan | G01N 23/2255 250/287 |
| 2011/0006209 A1 | | 1/2011 | Yoshikawa | |
| 2011/0089322 A1 | * | 4/2011 | Schoenecker | H01J 37/1472 250/307 |
| 2011/0147578 A1 | * | 6/2011 | Schultz | H01J 49/142 250/282 |

(Continued)

FOREIGN PATENT DOCUMENTS

JP    S61 57464 U    4/1986

OTHER PUBLICATIONS

International Search Report for Application No. PCT/EP2020/080793, dated Jan. 29, 2021,6 pages.

(Continued)

*Primary Examiner* — David A Vanore
(74) *Attorney, Agent, or Firm* — Kilpatrick Townsend & Stockton LLP (57) ABSTRACT

A secondary charged particle imaging system comprising: a backscattered electron detector module, wherein the backscattered electron detector module is rotatable between a first angular position and a second angular position about an axis.

25 Claims, 6 Drawing Sheets

(56) References Cited

U.S. PATENT DOCUMENTS

| | | | |
|---|---|---|---|
| 2011/0272577 A1* | 11/2011 | Lanio | H01J 37/1471 |
| | | | 250/307 |
| 2011/0297827 A1 | 12/2011 | Asai et al. | |
| 2012/0273679 A1 | 11/2012 | Bewick et al. | |
| 2013/0206985 A1* | 8/2013 | Turner | G01N 23/20066 |
| | | | 250/310 |
| 2013/0270438 A1* | 10/2013 | Lanio | H01J 37/244 |
| | | | 250/310 |
| 2014/0284477 A1 | 9/2014 | Ebine et al. | |
| 2014/0339424 A1* | 11/2014 | Glasmachers | H01J 49/424 |
| | | | 250/288 |
| 2016/0020067 A1 | 1/2016 | Iwasawa | |
| 2016/0178543 A1* | 6/2016 | Schillinger | G01N 23/203 |
| | | | 250/307 |
| 2016/0247662 A1* | 8/2016 | Fujii | H01J 37/305 |
| 2017/0224208 A1* | 8/2017 | Bublitz | A61B 3/102 |
| 2018/0174798 A1* | 6/2018 | Boguslavsky | H01J 37/3056 |
| 2018/0275275 A1* | 9/2018 | Lundquist | G01S 17/32 |
| 2020/0174102 A1* | 6/2020 | Asselin | G01S 17/42 |
| 2020/0381208 A1* | 12/2020 | Firnkes | H01J 37/285 |
| 2020/0395190 A1* | 12/2020 | Han | G06T 7/11 |

OTHER PUBLICATIONS

Written Opinion of the International Searching Authority for Application No. PCT/EP2020/080793, dated Jan. 29, 2021, 9 pages.

* cited by examiner

Moving a
backscatterd electron — 802
detector by an angle.

FIG. 8

SECONDARY CHARGED PARTICLE IMAGING SYSTEM

Aspects of the disclosure relate to scanning charged particle beam device, particularly for image generation on a specimen. Aspects relate in particular to a secondary charged particle imaging system. Another aspect relates to a scanning electron microscope including the backscattered electron detector module. A further aspect relates to a method of operating a secondary charged particle imaging system.

TECHNICAL BACKGROUND

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Charged particle beam apparatuses typically make use of a charged particle imaging system. A charged particle imaging system may be configured for single-beam or multi-beam imaging. The following describes a charged particle imaging system with improved performance.

SUMMARY

In view of the above, provided are a secondary charged particle imaging system, a charged particle beam device, and a method of operating a secondary charged particle imaging system.

According to one aspect, a secondary charged particle imaging system, the secondary charged particle imaging system including a backscattered electron detector module, and wherein the backscattered electron detector module is rotatable between a first angular position and a second angular position about an axis.

According to one aspect, a charged particle beam device including the secondary charged particle imaging system.

According to one aspect, a method of operating the secondary charged particle imaging system including rotating the backscattered electron detector between a first angular position and a second angular position about an axis.

Further advantages, features, aspects and details that can be combined with embodiments described herein are evident from the dependent claims, the description and the drawings.

BRIEF DESCRIPTION OF THE FIGURES

The details will be described in the following with reference to the figures, wherein.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

The reference numbers used in the figures are merely for illustration. The aspects described herein are not limited to any particular embodiment. Instead, any aspect described herein can be combined with any other aspect(s) or embodiment(s) described herein unless specified otherwise.

Figure 1:
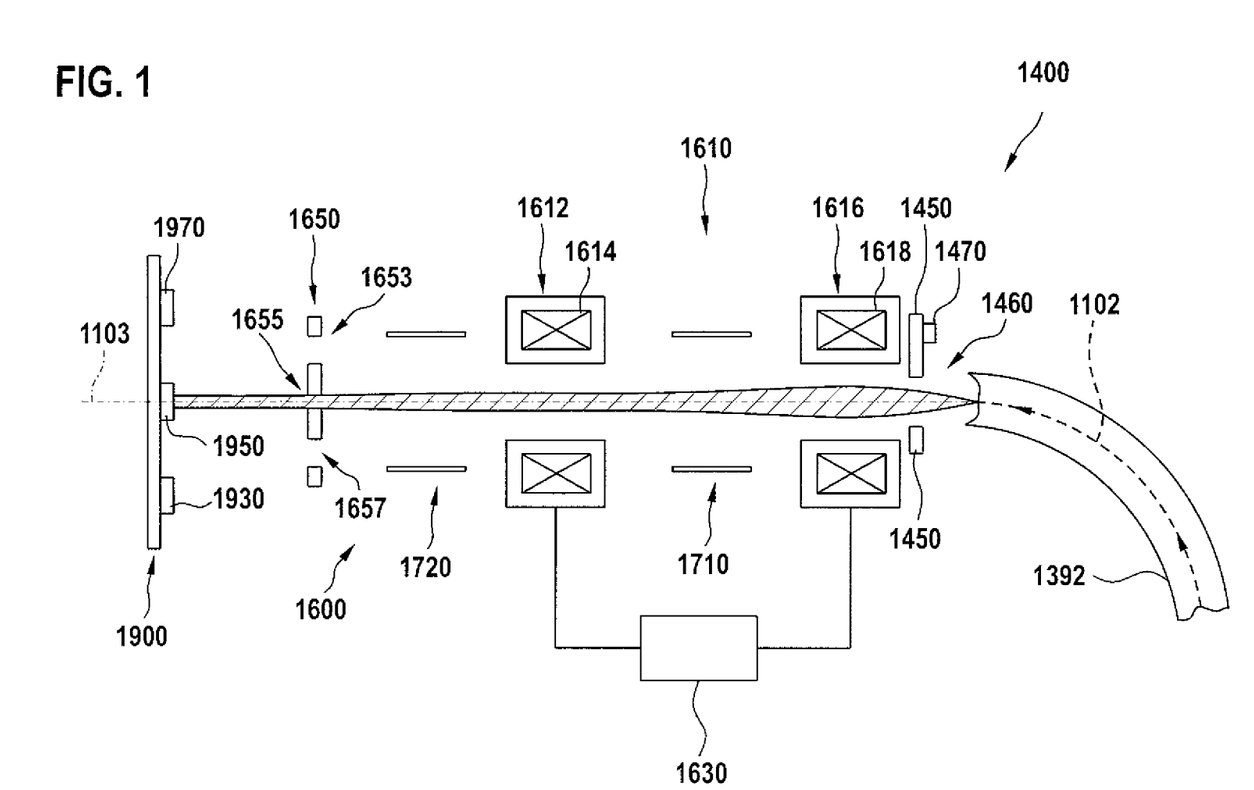
FIG. 1 is a simplified side view schematic of a secondary charged particle imaging system according to embodiments described herein.

FIG. 1 shows a simplified side view schematic of a secondary charged particle imaging system. According to embodiments described herein, the secondary charged particle imaging system includes a backscattered electron detector module.

The backscattered electron detector module 1400 may be configured to collect and/or detect backscattered electrons, e.g. on-axial backscattered electrons, in an electron beam column. For example, the backscattered electrons can be backscattered electrons of a signal charged particle beam 1102. The backscattered electron detector module 1400 may be configured to allow the signal charged particle beam 1102 to pass through. According to embodiments, the backscattered electron detector module 1400 may be configured to be moveable and/or rotatable, such as between a first position 5452 and a second position 5454. The first position 5452 and second position 5454 may be angular positions. In an example, the backscattered electron detector module 1400 may be configured to allow the signal charged particle beam 1102 to pass through the backscattered electron module in the first position 5452. The backscattered electron module 1400 may be configured to collect and/or detect backscattered electrons and/or signals in the signal charged particle beam 1102 in the second position 5454.

Accordingly, the backscattered electron detector module 1400 may include an aperture 1460. The backscattered electron detector module 1400 may include a backscattered electron detector element 1470. The aperture 1460 and the backscattered electron detector element 1470 may be arranged on a backscattered electron detector holder 1450. The aperture 1460 and the backscattered electron detector element 1470 may be arranged in a plane or in planes parallel to each other. For example, the backscattered electron detector element 1470 is supported on the backscattered electron detector holder 1450 and the aperture 1460 is formed in the backscattered electron detector holder 1450. In another example, the aperture 1460 may be fixed in a position on the optical axis 1103 and the backscattered electron detector holder 1450 is moveable between the first position 5452 and the second position 5454. The optical axis 1103 is an optical axis of the signal charged particle beam 1102. In a preferred embodiment, the aperture 1460 is arranged on the optical axis 1103 and the backscattered electron detector element 1470 is arranged off the optical axis 1103 when the backscattered electron detector module 1400 is in the first position 5452. In the preferred embodiment, the backscattered electron detector element 1470 is arranged on the optical axis 1103 and the aperture 1460 is arranged off the optical axis 1103 when the backscattered electron detector module 1400 in the second position 5454. The phrase 'on the optical axis' may be understood as a position that is at least partially, preferably substantially, overlapping or coinciding with a position of the signal charged particle beam 1102. The phrase 'off the optical axis' may be understood as a position that is at least partially, preferably substantially, and even more preferably completely, distinct or not overlapping with a position of the signal charged particle beam 1102.

According to one embodiment, the backscattered electron detector module 1400 includes the backscattered electron detector element 1470 and the aperture 1460. Alternatively, the aperture 1460 may be replaced by a recess or the backscattered electron detector module 1400 may be moveable by an angle sufficiently large that the signal electrons or signal charged particle beam 1102 can pass next to the backscattered electron detector module 1400.

In embodiments, there may be a secondary charged particle optics module and/or a beam bender. The backscattered electron detector module 1400 may be arranged before the secondary charged particle optics module 1600 and/or after the beam bender 1392. For example, the backscattered electron detector module 1400 may be arranged between the secondary charged particle optics module 1600 and the beam bender 1392. The backscattered electron detector module 1400, the aperture 1460 and/or the backscattered electron detector element 1470 may be arranged after or downstream of the beam bender 1392. The backscattered electron detector module may be arranged immediately or directly after or downstream of the beam bender. The backscattered electron detector element 1470 and/or the aperture 1460 may be arranged before or upstream of the secondary charged particle optics module 1600. The backscattered electron detector module may be arranged immediately or directly before or upstream of the secondary charged particle optics module 1600. 'After/before' and/or 'downstream/upstream' can be understood with respect to the propagation of the signal charged particle beam 1102. For example, 'downstream' may understood to be similar to 'after' and vice versa, 'upstream' to be similar to 'before'.

Accordingly, in an example, the secondary charged particle optics module 1600 and/or the aperture 1460 is in a functional position in the first position 5452. In another example, the signal charged particle beam 1102 passes through the backscattered electron detector module 1400 in the first position 5452. Similarly, in a further example, the backscattered electron detector module 1400 and/or the backscattered electron detector element 1470 is in a functional position in the second position 5454. In yet another example, the signal charged particle beam 1102 is intercepted and/or detected by the backscattered electron detector module 1400 and/or the backscattered electron detector element 1470 in the second position 5454. Accordingly, in an example, the secondary charged particle optics module 1600, the aperture 1460, and the beam bender 1392 are arranged, particularly in that order, on the optical axis 1102 in the first position 5452. In another example, the secondary charged particle optics module 1600, the backscattered electron detector element 1460, and the beam bender 1392 are arranged, particularly in that order, on the optical axis 1102 in the second position 5454. In embodiments, that can be combined with other embodiments described herein, the backscattered electron detector module 1400 and/or the backscattered electron detector element 1470 may be arrangeable at or adjacent to a point of the smallest cross-section of the signal charged particle beam 1102. A point of the smallest cross-section of the signal charged particle beam 1102 may be after or downstream of the beam bender 1392, in particular immediately after the beam bender 1392. In embodiments, it is considered beneficial to arrange the backscattered electron detector module 1400 and/or the second lens 1616 as close as possible to the beam bender 1392.

The arrangement of the backscattered electron detector module 1400, such as the backscattered electron detector element 1470, as described above, can provide a good performance of backscattered electron efficiency. For example, detection efficiency can be improved by up to 30% compared to arranging the backscattered electron detector module 1400, such as the backscattered electron detector element 1470, after or downstream of the secondary charged particle optics module 1600.

FIG. 1 shows a simplified side view schematic of a secondary charged particle imaging system. According to embodiments described herein, the secondary charged particle imaging system includes a beam bender.

The beam bender 1392 may be for bending the signal charged particle beam 1102. The beam bender 1392 may have a shape or cross-section of a sector, in particular a hemispherical sector. The beam bender 1392 may be configured for changing the direction of the signal charged particle beam 1102 so that the travel direction of the signal charged particle beam 1102 entering the beam bender 1392 is different when compared to the travel direction of the signal charged particle beam 1102 leaving the beam bender 1392. The beam bender 1392 may be arranged to direct the signal charged particle beam 1102 further away from a primary charged particle beam 7101. For example, the beam bender 1392 may deflect the signal charged particle beam 1102, in particular by electrostatic means. The beam bender 1392 may be arranged downstream of a means of beam separation. Beam separation may be understood as a means to separate a primary charged particle beam from a secondary charged particle beam. A secondary charged particle beam 1102 may be understood as a charged particle beam originating from a sample 7350. A primary charged particle beam 7101 may be understood as a charged particle beam that impinges on a sample 7350. The beam bender may be a spherical or sector beam benders. The beam bender 1392 may deflect and/or stigmatically focus a charged particle beam.

In embodiments, the beam bender 1392 acting on the signal charged particle beam 1102 is arranged, with respect to the signal charged particle beam 1102, upstream of the second lens 1616. In the drawing plane of FIG. 1, the beam bender 1392 is arranged to the right of the second lens 1616. As shown, the signal charged particle beam 1102 enters the beam bender 1392 from below and travels through the beam bender 1392. The signal charged particle beam 1102 exiting the beam bender travels along a substantially horizontal direction. The signal charged particle beam 1102 may travel from the beam bender 1392 to the second lens 1616 of the lens system 1610. As illustrated in FIG. 1, the second lens 1616 may be arranged, with respect to the signal charged particle beam 1102, downstream of the beam bender 1392, and/or the backscattered electron detector module 1400. In a preferred embodiment, the second lens 1616 may be the next element acting on the signal charged particle beam 1102 leaving the backscattered electron detector module. An opening angle of the secondary charged particle beam, as described herein, may be an opening angle of the signal charged particle beam exiting the beam bender 1392.

FIG. 1 shows a simplified side view schematic of a secondary charged particle imaging system. According to embodiments described herein, the secondary charged particle imaging system includes a secondary charged particle optics module.

In embodiments, the secondary charged particle optics module 1600 includes a lens system 1610. The lens system 1610 may include a first lens 1612 and a second lens 1616. The first lens 1612 may be distanced from the second lens 1616. For example, the distance between the first lens 1612 and the second lens 1616 may be in the range from 40 to 200 mm.

With respect to the drawing plane of FIG. 1, the first lens 1612 and/or the second lens 1616 extend along a vertical ("up-down") direction. The first lens 1612 may be arranged between the aperture plate 1650 and the second lens 1616.

In the drawing plane of FIG. 1, the signal charged particle beam 1102 travels from right to left. The signal charged particle beam 1102 enters the second lens 1616 of the lens system 1610 from the right-hand side of the second lens 1616. The signal charged particle beam 1102 shown in FIG. 1 travels through the second lens 1616 and subsequently through the first lens 1612 of the lens system 1610. As shown, the signal charged particle beam 1102 traveling through the lens system 1610 travels substantially along the optical axis 1103.

The first lens 1612 and/or the second lens 1616 may be adapted for shaping, focusing and/or defocusing the signal charged particle beam 1102. The first lens 1612 and/or the second lens 1616 may be adapted for adjusting an opening angle of the signal charged particle beam 1102. The signal charged particle beam 1102 can be made divergent or convergent as desired. Accordingly, collection efficiency of signal charged particles by the detector arrangement 1900 can be improved. An opening angle of the signal charged particle beam 1102 may be an opening angle of the signal charged particle beam 1102 exiting a beam bender arranged upstream, with respect to the propagation of the signal charged particle beam 1102, of the lens system 1610.

The lens system 1610 may be adapted for providing one or two cross-overs of the signal charged particle beam 1102. Alternatively, the lens system 1610 may be adapted for allowing the signal charged particle beam to pass through the lens system 1610 without a cross-over.

The first lens 1612 may include an electrostatic lens portion and/or a magnetic lens portion. The first lens 1612 may be a compound lens including both an electrostatic lens portion and a magnetic lens portion. Similarly, the second lens 1616 may include an electrostatic lens portion and/or a magnetic lens portion. An electrostatic lens portion of the first lens 1612 and/or an electrostatic lens portion of the second lens 1616 may be adapted for shaping, focusing and/or defocusing the signal charged particle beam. A magnetic lens portion of the first lens 1612 and/or of the second lens 1616 may be adapted for compensating a Larmor rotation of an objective lens.

It is considered beneficial to arrange the second lens 1616 as close as possible to the backscattered electron detector module 1400 and/or the beam bender 1392. It is also considered beneficial to arrange the first lens 1612 sufficiently far away from the beam bender 1392. According to embodiments, which can be combined with other embodiments described herein, the distance between the backscattered electron detector module 1400 and the second lens 1616 is 60 mm or below, in particular 45 mm or below, more particularly 35 mm or below. According to embodiments, which can be combined with other embodiments described herein, the distance between the beam bender 1392 and the first lens 1612 is 50 mm or above, more particularly 100 mm or above, for example 115 mm or above.

The first lens 1612 may include a first magnetic lens portion 1614 adapted for generating a magnetic field. The first magnetic lens portion 1614 may include a coil for generating the magnetic field. The first magnetic lens portion 1614 may have an iron cladding. Similarly, the second lens 1616 may include a second magnetic lens portion 1618. The second magnetic lens portion 1618 may include similar components compared to the first magnetic lens portion 1614. The first magnetic lens portion 1614 and/or the second magnetic lens portion 1618 may be adapted for compensating a Larmor rotation of the signal charged particle beam 1102. The Larmor rotation may be introduced in the signal charged particle beam 1102 due to a variation of the strength of a magnetic field generated by the objective lens of the charged particle beam device, e.g., a magnetic field (not shown in FIG. 1). The first magnetic lens portion 1614 and/or the second magnetic lens portion 1618 may be adapted for rotating the signal charged particle beam 1102. The rotation of the signal charged particle beam 1102 may be a rotation around the optical axis 1103 defined by the aperture plate 1650 and may be a clock-wise or a counterclockwise rotation. The first magnetic lens portion 1614 may be adapted for rotating the signal charged particle beam 1102 by a first angle A1. The first angle A1 may lie in the range from −45 to 45 degrees. Accordingly, a Larmor rotation from −45 to 45 degrees can be compensated by the first magnetic lens portion. The second magnetic lens portion 1618 may be adapted for rotating the signal charged particle beam 1102 by a second angle A2. The second angle A2 may lie in the range from −45 to 45 degrees. Accordingly, a Larmor rotation from −45 to 45 degrees can be compensated for by the second magnetic lens portion. A lens system where the first lens includes a first magnetic lens portion and the second lens includes a second magnetic lens portion, such as e.g. the lens system 1610 shown in FIG. 1, may be adapted for rotating the signal charged particle beam by a total angle lying in the range from −|A1|−|A2| to |A1|+|A2| where |A1| and |A2| denote the absolute values of A1 and A2, respectively. Accordingly, a Larmor rotation lying in the range from −|A1|−|A2| to |A1|+|A2| can be compensated for by the lens system. For example, a Larmor rotation between −90 and 90 degrees can be compensated for.

An advantage of compensating the Larmor rotation of the signal charged particle beam with a first magnetic lens portion included in the first lens and/or a second magnetic lens portion included in the second lens is that no mechanical rotation of the aperture plate and/or the detector arrangement for compensating the Larmor rotation is required.

The first lens 1612 may be a compound lens including an electrostatic lens portion (not shown) and a first magnetic lens portion 1614. Compared to a first lens including an electrostatic lens portion but no first magnetic lens portion, a compound lens provides additional degrees of freedom for influencing the secondary charged particle beam. In particular, two such additional degrees of freedom provided by a first magnetic lens portion 1614 may include the magnitude and direction of a current passed through a coil included in the first magnetic lens portion 1614. Similar considerations apply to embodiments where the second lens is a compound lens.

The magnetic field generated by the first magnetic lens portion 1614 may affect the focusing of the signal charged particle beam 1102 onto the aperture plate 1650. Such a focusing effect may be compensated for or further enlarged by setting the excitation of the electrostatic lens portion of the first lens 1612 to an appropriate value. For example, the focusing effect may be affected by reducing or increasing the refractive power of the electrostatic lens portion. Accordingly, the signal charged particle beam 1102 may be shaped, focused and/or defocused in a desired manner. Accordingly, via a combined action of the first magnetic lens portion 1614 and the electrostatic lens portion, the first lens 1612 may be configured to compensate a Larmor rotation of the objective lens and/or shape, focus and/or defocus the signal charged particle beam 1102. Similar considerations apply to embodiments where the second lens is a compound lens.

As an alternative to the illustration of FIG. 1 where both the first lens 1612 and the second lens 1616 include a magnetic lens portion, according to other embodiments described herein, it may be that only one of the first lens 1612 and the second lens 1616 includes a magnetic lens portion for compensating the Larmor rotation. According to embodiments, at least one of the first lens and second lens comprises a magnetic lens portion for compensating the Larmor rotation of the objective lens.

According to yet further embodiments, which can be combined with other embodiments described herein, the first lens and second lens comprise or consist of an electrostatic lens portion. For example, the first lens and second lens do not comprise a magnetic lens portion. As an optional modification, particularly for such embodiments, a Larmor rotation can be provided or compensated by a coil, e.g. a Larmor rotation coil. For example, the Larmor rotation coil can be downstream of the first lens and/or second lens.

According to embodiments, the secondary charged particle optics module 1600 may include a controller 1630. The controller 1630 shown in FIG. 1 may be configured for controlling the excitation of the first lens 1612 and the excitation of the second lens 1616. Controlling the excitation of the first lens 1612 may include controlling the excitation of an electrostatic lens portion of the first lens 1612 and/or controlling the excitation of a magnetic lens portion of the first lens 1612. Similar considerations apply to the case where the second lens 1616 includes an electrostatic and/or magnetic lens portion.

An electrostatic lens portion of the first lens 1612 may include one or more electrodes for generating an electric field. A potential may be applied to the electrodes for generating the electric field. The electric field may be generated under the control of the controller 1630. In particular, the strength of the electric field may be controlled by, determined by and/or adjusted under the control of the controller 1630. A magnetic lens portion of the first lens 1612 may each include one or more coils for generating a magnetic field. A current may be passed through the coils for generating the magnetic field. The magnetic field may be generated under the control of the controller 1630. In particular, the strength of the magnetic field as well as the field direction determined by the current direction through the coils may be controlled by, determined by and/or adjusted under the control of the controller 1630. Similar considerations apply to an electrostatic lens portion and/or magnetic lens portion included in the second lens 1616. According to embodiments described herein, the first lens may include an electrostatic lens portion, a magnetic lens portion, or both, an electrostatic lens portion and a magnetic lens portion. According to embodiments described herein, the second lens may include an electrostatic lens portion, a magnetic lens portion, or both, an electrostatic lens portion and a magnetic lens portion. Providing a combined electrostatic magnetic lens for the first and/or second lens, i.e. having an electrostatic lens portion and a magnetic lens portion, may allow for increased degrees of freedom in adjusting the signal charged particle beam, particularly with respect to Larmor rotation.

The controller 1630 may be configured for independently controlling the excitation of the first lens 1612 and of the second lens 1616. Accordingly, the controller 1630 may allow controlling the focusing, defocusing and/or shaping of the signal charged particle beam 1102 by the first lens 1612 independently of controlling the focusing, defocusing and/or shaping of the signal charged particle beam 1102 by the second lens 1616. Independently controlling the excitations of the first lens 1612 and of the second lens 1616 provides that, in the topography detection mode of the secondary charged particle imaging system, a first sub-beam of the signal charged particle beam 1102 passes through the first opening 1653 and is detected by the first detection element 1970, that a central sub-beam of the signal charged particle beam 1102 passes through the central opening 1655 and is detected by the central detection element 1950, and that a second sub-beam of the signal charged particle beam 1102 passes through the second opening 1657 and is detected by the second detection element 1930.

According to embodiments, which can be combined with other embodiments described herein, the controller 240 may be configured to switch between the topography detection mode and the bright-field detection mode by adapting the excitations of the first lens 1612 and of the second lens 1616. At a first moment in time, the excitations of the first lens 1612 and of the second lens 1616 may be set to a first configuration under the control of the controller 1630 to image the signal charged particle beam 1102 in the topography detection mode. At a second, e.g. later, moment in time, the excitations of the first lens 1612 and of the second lens 1616 may be set to a second configuration under the control of the controller 1630 to image the signal charged particle beam 1102 in the bright field detection mode. Accordingly, the flexibility of the system is enhanced.

According to embodiments, which can be combined with other embodiments described herein, the secondary charged particle imaging system may be configured to switch between a secondary charged particle detection mode and a backscattered electron detection mode by rotating the backscattered electron detector module 1400 between the first position 5452 and the second position 5454 respectively. Accordingly, the flexibility of the system is further enhanced.

An advantage of having a controller configured for switching between the topography detection mode and the bright field detection mode, compared to a system configured for operating solely according to either topography detection mode or according to the bright field detection mode, is that multiple aspects of the sample, relating to e.g. topography information, defects on the sample, chemical constituents of the sample, and the like, can be analysed by a single system.

FIG. 1 shows a simplified side view schematic of a secondary charged particle imaging system. According to embodiments described herein, the secondary charged particle imaging system includes an aperture plate.

The aperture plate 1650 may include a first opening 1653, a central opening 1655 and/or a second opening 1657. The first opening 1653 may be distanced from the second opening 1657. The aperture plate 1650 may be arranged parallel to and/or distanced from the first lens 1612 and/or to the second lens 1616. The first opening 1653 may be formed, with respect to the vertical direction, at an upper portion of the aperture plate 1650. The central opening 1655 may be formed at a central portion of the aperture plate 1650. The second opening 1657 may be formed at a lower portion of the aperture plate 1650. The aperture plate 1650 may define an optical axis 1103. In an example, the distance between the centre of the aperture plate 1650 and the centre of the first lens 1612 may be in the range from 40 to 200 mm.

The aperture plate 1650, the first lens 1612 and/or the second lens 1616 may be parallel to a plane defined by the detector arrangement 1900.

In addition to the first opening 1653, the central opening 1655, and the second opening 1657, the aperture plate 1650 may include further openings. For example, the aperture plate 1650 can include five openings. The first opening 1653, the second opening 1657 and any further openings may be located around the optical axis 1103 such that the aperture plate 1650 has a four-fold rotational symmetry with respect to the optical axis 1103. The first opening 1653, the second opening 1657 and any further openings may be radially outward openings with respect to the optical axis 1103. In an example, the diameter or the corresponding dimension of the central opening 1655 may be 1 mm to 4 mm. In another example, the first opening 1653, the second opening 1657 and/or the further openings may have a diameter or a corresponding dimension in a range from 3 mm to 15 mm. In yet another example, the distance between the centre of the first opening and the centre of the second opening may be in the range from 4 to 15 mm.

The aperture plate 1650 may comprise an integer number N of further openings, wherein the first opening 1653, the second opening 1657 and the N further openings are located around the optical axis 1103 of the aperture plate 1650 such that the aperture plate 1650 has an N+2-fold rotational symmetry with respect to the optical axis 1650 of the aperture plate 1650.

In a yet further example, the aperture plate may have a thickness of 5 mm or above, more particularly the thickness may be from 10 mm to 20 mm. The thickness of the aperture plate may be a thickness in an axial direction of the aperture plate and/or in a direction parallel to the optical axis defined by the aperture plate. Having a thickness from 10 mm to 20 mm may provide an increased separation of the sub-beams of the signal charged particle beam. The increased separation allows for the utilization of a detector arrangement where the detection elements, e.g. the first detection element, the second detection element and/or the central detection element, may be standard pin diodes with a 5 mm diameter. Accordingly, a feasible design of the detector arrangement may be provided. Further, in light of the fact that the reach-through of an acceleration field generated between the aperture plate and the detector arrangement is influenced by the thickness of the aperture plate, a reduced operating voltage is a beneficial side effect from having a minimum thickness of the aperture plate of at least 5 mm. Accordingly, better high voltage immunity, reliability and stability may be provided.

With respect to the propagation of the secondary charged particle beam, the aperture plate is arranged upstream of the detector arrangement.

FIG. 1 shows a simplified side view schematic of a secondary charged particle imaging system. According to embodiments described herein, the secondary charged particle imaging system includes one or more deflection elements.

The one or more deflection elements may be configured for influencing the signal charged particle beam 1102. By providing one or more deflection elements, the information carried by the signal charged particles is more easily conserved as the signal charged particle beam 1102 is transferred from the sample to the detector arrangement 1900. As shown, a first deflection element 1720 and a second deflection element 1710 may be arranged between the beam bender 1392 and the detector arrangement 1900. According to alternative embodiments, the secondary charged particle imaging system may include the first deflection element 1720 without the second deflection element 1710 or vice versa, or may include additional deflection elements arranged between the beam bender 1392 and the detector arrangement 1900. A third deflection element (not shown) may be provided between the beam bender 1392 and the second lens 1616. Alternatively, a third deflection element may be provided upstream, with respect to the signal charged particle beam 1102, of the beam bender 1392. For example, a third deflection element may be provided between a beam separator, as described herein, and the beam bender. A third deflection element improves alignment and/or imaging of the signal charged particle beam on the detector arrangement. Accordingly, signal generation, and thus contrast, can be improved. The improved signal generation results in better throughput, particularly for EBI applications. The third deflection element may be the next deflection element through which the signal charged particle beam 1102 leaving the beam bender 1392 passes. The third deflection element may be arranged directly downstream, with respect to the signal charged particle beam 1102, of the beam bender 1392 or the backscattered electron detector module 1400. Alternatively, the third deflection element may be provided between the first lens 1612 and the detector arrangement 1900. Providing the third deflection element between the beam bender and the second lens or between the first lens and the detector arrangement, as described above, has the advantage that a potential space restriction for a third deflection element is not as critical as compared to e.g. a third deflection element being positioned between a beam separator and the beam bender (insufficient separation between signal charged particle beam and primary charged particle beam). Arranging the third deflection element between a beam separator and the beam bender may provide an improved anti-scanning of the signal charged particle beam. In particular, deviations of the signal charged particle beam emanating from an off-axial position with respect to the axis of a signal charged particle beam starting in the centre of the field of view may be more easily compensated for.

As shown in FIG. 1, the second deflection element 1710 may be arranged between the first lens 1612 and the second lens 1616. The second deflection element 1710 may influence the signal charged particle beam 1102 traveling from the second lens 1616 to the first lens 1612. The first deflection element 1720 may be arranged between the aperture plate 1650 and the first lens 1612. The first deflection element 1720 may influence the signal charged particle beam 1102 traveling from the first lens 1612 to the aperture plate 11650. The first deflection element 1720 and/or the second deflection element 1710 may be aligned to the optical axis 1103, as illustrated in FIG. 1. The optical axis 1103 may extend longitudinally through the first deflection element 1720 and/or through the second deflection element 1710.

A deflection element for influencing the signal charged particle beam, such as e.g. the first deflection element 1720 and/or the second deflection element 1710 shown in FIG. 1, may include an electrostatic deflection portion and/or a magnetic deflection portion. An electrostatic deflection portion may include an electrostatic dipole, quadrupole or higher order multi-pole element. A magnetic deflection portion may include a magnetic dipole, quadrupole or higher order multi-pole element. A deflection element may include two deflection plates arranged on opposite sides of the optical axis defined by the aperture plate and/or arranged on opposite sides of the signal charged particle beam. For deflection in two directions, two perpendicular dipole fields may be provided or two deflectors may be provided that may be operated to allow for one dipole field, which can be rotated depending on the operation of the two deflectors. For example, individual fields of the two deflectors separately can enclose an angle of 70° to 110°, such as 90°. As shown in FIG. 1, the first deflection element 1720 and/or the second deflection element 1710 may each include two deflection plates for deflecting the signal charged particle beam in a first direction.

A deflection element for influencing the signal charged particle beam may be adapted to align the signal charged particle beam with the optical axis of the aperture plate, e.g. in the bright field detection mode. Additionally, or alternatively, a deflection element, e.g. a third deflection element as described herein, may be adapted for anti-scanning the signal charged particle beam. The signal charged particle beam may be anti-scanned in a charged particle beam device where the primary charged particle beam is scanned over a sample. Scanning the primary charged particle beam over the sample may provide an unwanted deflection of the signal charged particle beam, wherein the position of the signal charged particle beam impinging onto the detector arrangement and/or the position of the signal charged particle beam with respect to the aperture plate may depend on the primary charged particle beam position being scanned over the sample. This dependence may lead to a poor detection quality and a blurred image. Anti-scanning of the signal charged particle beam, e.g. by the first deflection element 1720 and/or by the second deflection element 1710 shown in FIG. 1, may compensate for the deflection of the signal charged particle beam resulting from scanning the primary charged particle beam and/or may align the signal charged particle beam with a target axis, e.g. the optical axis defined by the aperture plate, independent of the position of the primary charged particle beam being scanned over the sample. Accordingly, off-axis aberrations of the signal charged particle beam may be avoided. Anti-scanning of the signal charged particle beam may be particularly beneficial for a charged particle beam device having a large field of view. According to embodiments, which can be combined with other embodiments described herein, the field of view of the charged particle beam device may be 500 µm or above.

To provide an anti-scanning of the signal charged particle beam with a deflection element, a deflection voltage may be applied to the deflection element. The deflection voltage may be synchronized with the scanning of the primary charged particle beam to compensate a deflection of the signal charged particle beam resulting from the scanning of the primary charged particle beam.

A deflection element configured for anti-scanning the signal charged particle beam may be arranged, with respect to the signal charged particle beam, upstream of the aperture plate, upstream of the first lens and/or between the first lens and the second lens. Compared to anti-scanning the signal charged particle beam downstream of the aperture plate, anti-scanning upstream of the aperture plate has the advantage that the signal charged particle beam can be more easily aligned with a target axis. Further, anti-scanning upstream of the aperture plate may be advantageous for systems where an energy filter is provided at the aperture plate, as the energy filter has an increased sensitivity to the position of the signal charged particle beam with respect to the optical axis 1103.

FIG. 1 shows a simplified side view schematic of a secondary charged particle imaging system. According to embodiments described herein, the secondary charged particle imaging system includes a detector arrangement.

The detector arrangement 1900 may include a first detection element 1970, a central detection element 1950, and/or a second detection element 1930. The second detection element 1930 may be distanced from the first detection element 1970. The first detection element 1970, the central detection element 1950, and/or the second detection element 1930 may be supported by a holder of the detector arrangement 1900. The holder may include a holder plate on which the first detection element 1970, the central detection element 1950, and/or the second detection element 1930 may be attached. As illustrated in FIG. 1, the first detection element 1970, central detection element 1950, and/or second detection element 1930 may be arranged, respectively, with respect to the vertical direction, at an upper, central, and/or lower portion of the detector arrangement 1900. The first detection element 1970 and the first opening 1653 may be arranged on a first side of a reference plane containing the optical axis 1102. The second detection element 1930 and the second opening 1657 may be arranged on a second side of the reference plane, wherein the second side is opposite to the first side.

In addition to the first detection element 1970, the central detection element 1950, and the second detection element 1930, the detector arrangement 1900 may include further detection elements. For example, the detector arrangement 1900 may include five detection elements, and/or the same number of detection elements as the number of openings provided in the aperture plate 1650. Each of the detection elements may be associated with one corresponding opening in the aperture plate 1650. According to embodiments, which can be combined with other embodiments described herein, the detector arrangement 1900 includes an integer number N of further detection elements, the integer number N either being zero or being larger than zero.

A detection element of the detector arrangement 1900, such as e.g. the first detection element 1970, the central detection element 1950, and/or the second detection element 1930 may e.g. be a pin diode detector or a scintillator detector. Particularly for EBI applications, high throughput is desired, which results in the need for very fast sensors. Accordingly, pin diode detectors can be used. The obtainable bandwidth may depend on the size of the pin diode detector. A sensor area of 1 $mm^2$ or below may be utilized.

The first detection element 1970, the central detection element 1950, the second detection element 1930, and/or further detection elements of the detector arrangement 1900 may be individual detectors which may be spatially separated from each other. The individual signals obtained by the detection elements of the detector arrangement can be combined (e.g. subtracted) to enhance contrast. Compared to e.g. detection elements which are arranged proximate to each other, e.g. segmented pin diodes, having spatially separated detection elements provides the advantage that problems relating to a pin diode area which separates active segments (e.g. charging, signal loss, cross-talk) can be more easily overcome. Further, spatially separated detection elements are less expensive, have a shorter development cycle, an improved flexibility in sensor design and/or a faster time-to-market.

The distance between the first detection element and the second detection element may be in the range from 1 to 20 mm. The distance between the first detection element and the central detection element may be in the range from 1 to 14 mm.

Compared to e.g. a bright field detector, the detector arrangement 1900 including multiple detection elements, as described herein, provides an enhanced sensitivity to changes in the topography of the sample, e.g. resulting from physical defects. The multiple detection elements may collect only secondary charged particles within certain ranges of take-off angles at the sample. Accordingly, an enhanced contrast of the inspected features and/or defects, e.g. for defect inspection tools and review tools or critical dimensioning tools, may be provided.

The detector arrangement 1900 may be an integrated detector arrangement. The first detection element 1970, the central detection element 1950, and/or the second detection element 1930 may be integrated into the detector arrangement. The detection elements of the detector arrangement 1900 may be separated from each other in the integrated detector arrangement. The detection elements of the detector arrangement 1900 may be fixedly positioned in or at the detector arrangement 1900. The detection elements of the detector arrangement 1900 may be fixed onto a holder or holder plate of the detector arrangement 1900.

FIG. 1 shows a simplified side view schematic of a secondary charged particle imaging system. According to embodiments described herein, the secondary charged particle imaging system includes a signal charged particle beam 1102 and/or an optical axis 1103.

The optical axis 1103 may extend through a centre of the aperture plate 230. With respect to the drawing plane of FIG. 1, the optical axis 1103 extends along a horizontal ("left-right") direction perpendicular to the vertical direction. As shown, the signal charged particle beam 1102 may travel along the optical axis 1103. Alternatively, or in addition, the optical axis 1103 may be of the signal charged particle beam 1102, of the secondary charged particle optics module 1600, of the aperture plate 1650, and/or of the detector arrangement 1900.

The optical axis 1103 may extend through the central detection element 1950. The optical axis 1103 may be perpendicular or substantially perpendicular to a plane defined by the aperture plate 1650, to a plane defined by the first lens 1612 and/or to a plane defined by the second lens 1616. The terminology "substantially perpendicular" may refer to an angle between 90 and 110 degrees. The optical axis 1103 may be a symmetry axis of the aperture plate 1650, of the first lens 1612 and/or of the second lens 1616. The optical axis 1103 may be a symmetry axis of the aperture plate 1650, of the first lens 1612/and or of the second lens 1616.

Figure 2:
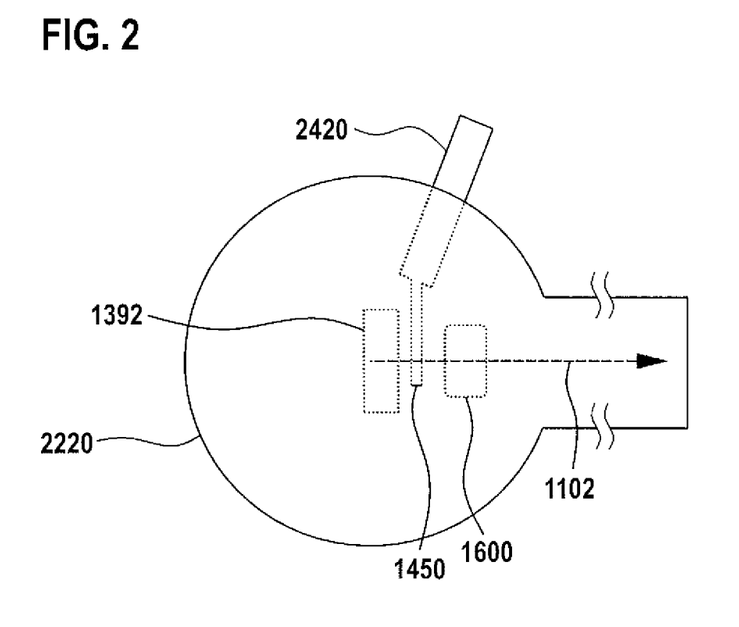
FIG. 2 is a simplified top view schematic of a secondary charged particle imaging system according to embodiments described herein.

FIG. 2 shows a simplified top view schematic of a secondary charged particle imaging system according to embodiments described herein. As illustrated in FIG. 2, a housing 2220 may be provided. The housing 2220 may provide a vacuum containment and/or vacuum state for the signal charged particle beam 1102. In a preferred embodiment, the housing 2220 may house at least some elements of the secondary charged particle imaging system, such as the beam bender 1392, backscattered electron detector module 1400, and the secondary charged particle optics module 1600. Accordingly, the beam bender 1392, backscattered electron detector holder 1450, backscattered electron detector element 1470, aperture 1460, and/or secondary charged particle optics module 1600 may be arranged within the housing 2220. In a preferred embodiment, the beam bender 1392 is arranged upstream of the backscattered electron detector module 1400, which in turn is arranged upstream of the secondary charged particle optics module 1600.

According to embodiments, an arm 2420, e.g. a rigid arm, may be provided. The arm 2420 may be connected to and/or support the backscattered electron detector holder 1450, backscattered electron detector element 1470, and/or the aperture 1460. The arm may be included in the backscattered electron detector module 1400. In an example, the arm 2420 extends into the housing 2220, extends outside the housing 2220, and/or extends through a side of the housing 2220. The arm 2420 may be rotatable. The arm 2420 may rotate about an axis. The axis may be arranged inside the housing 2220. The axis may be closer to a side of the housing 2220 than to the centre of the housing 2220. Accordingly, the backscattered electron detector module 1400, the backscattered electron detector holder 1450, the aperture 1460, and/or the backscattered electron detector element 1470 may be rotatable about the axis.

Figure 3:
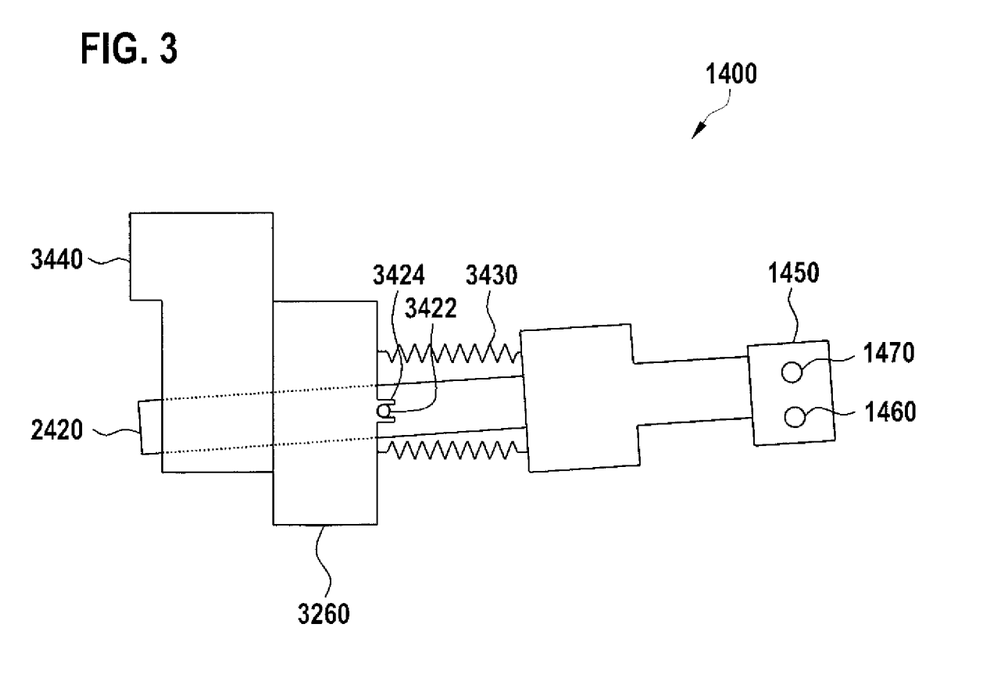
FIG. 3 is a simplified side view schematic of a backscattered electron detector module and a backscattered electron detector actuator module according to embodiments described herein.

FIG. 3 shows a simplified side view schematic of a backscattered electron detector module and a backscattered electron detector actuator module according to embodiments described herein. According to embodiments, a backscattered electron detector actuator module 3440, a bearing module 3260, a hinge joint slot 3424, a hinge joint pin 3422, and/or a flexible enclosure 3430 may be provided.

According to embodiments, the backscattered electron detector actuator module 3440 is configured for actuating, in particular moving, preferably rotating or tilting, the backscattered electron detector module 1400, for example, by actuating the arm 2420. The backscattered electron detector actuator module 3440 may include a pneumatic actuator, and/or a mechanical actuator. In another example, the backscattered electron detector actuator module 3440 includes a first limit stop, and optionally a second limit stop. The first limit stop can correspond to the first angular position 5452.

The second limit stop can correspond to the second angular position 5454. In an example, the backscattered electron detector actuator module 3440 is operated by a switch, such as a mechanical switch, pneumatic switch, or electrical switch. The backscattered electron detector actuator module 3440 may be configured for rotating the backscattered electron detector module 1400 and/or arm 2420 between the first angular position 5452 and the second angular position 5454. The backscattered electron detector actuator module 3440 may be coupled to, integrated with, or included in the housing 2220, the bearing module 3260, the arm 2420, and/or the backscattered electron detector module 1400. The backscattered electron detector actuator module 3440 may be arranged outside and/or on an outside face of the housing 2220 and/or bearing module 3260; as part of the housing 2220, the bearing module 3260, and/or the arm 2420; and/or on an end portion of the arm 2420.

According to embodiments, the arm 2420 includes a hinge joint pin 3422. The hinge joint pin 3422 may be configured to rotate within and/or as part of a hinge joint slot 3424. The hinge joint slot 3434 may be connected to and/or a part of the bearing module 3260. The hinge joint pin 3433 and hinge joint slot 3434 may work as a hinge joint and/or an axis for the rotation and/or tilt of the arm 2420 and/or backscattered electron detector module 1400.

According to embodiments, the flexible enclosure 3430 is configured to provide a vacuum containment and/or vacuum state of the backscattered electron detector element 1470. The flexible enclosure 3430 may be configured to maintain the hinge joint pin 3422, hinge joint slot 3424, and/or the bearing module 3260 at an ambient pressure, state, environment, and/or condition. The flexible enclosure 3430 may be coupled, attached, and/or connected, possibly in a hermetic or sealed manner, at a first end portion, to the housing 2220, and/or the bearing module 3260. The flexible enclosure 3430 may be similarly coupled, attached, and/or connected, possibly in a hermetic or sealed manner, at a second end portion, to the arm 2420 preferably between the axis and/or hinge joint pin 3422, and the backscattered electron detector element 1470, the aperture 1460, and/or the backscattered electron detector holder 1450. In an example, the flexible enclosure 3430 is a hose, a bellow, is flexible and/or is suitable for vacuum use. In yet another example, the flexible enclosure 3430 is a flexible bellow, provide sealing between air and vacuum, maintaining the moving parts of the hinge joint pin 3422 and hinge joint slot 3424, or some rotational joint, and/or moving parts of the bearing module 3260 on the air side or ambient side, and/or the backscattered electron detector element 1470 on the vacuum side and/or inside the housing 2220. The flexible enclosure 3430 may be pre-tensioned, preferably pre-tensioned in an assembled condition, and preferably axially pre-tensioned. The pre-tensioned flexible enclosure 3430 may apply a force to and/or pull the arm 2420 against the bearing module 3260 and/or the housing 2220. The flexible enclosure 3430 may be suitable for enclosing at least a part of the arm 2420, the hinge joint pin 3422, hinge joint slot 3424, and/or the axis of rotation of the backscattered electron detector module 1400.

According to embodiments, the bearing module 3260 is an axial bearing. The bearing module 3260 may be configured to support the arm 2420, and/or the backscattered electron detector module 1400. The bearing module 3260 and/or the housing 2220 may provide a reaction force to the arm 2420. The reaction force may be less than the pre-tensioning force of the flexible enclosure 3430, with the balance provided by a vacuum force in an operating condition and/or assembled condition. In an example, the reaction force may be 40 N or between 0 N and 100 N. In another example, the pre-tensioned flexible enclosure 3430 may have a pre-tensioned force of 60 N or more than the reaction force.

According to embodiments, the backscattered electron detector element 1470 may have a circular, square or polygonal cross-section and/or shape. The aperture 1460 may similarly have a circular, square, triangular or polygonal cross-section.

Figure 4A:
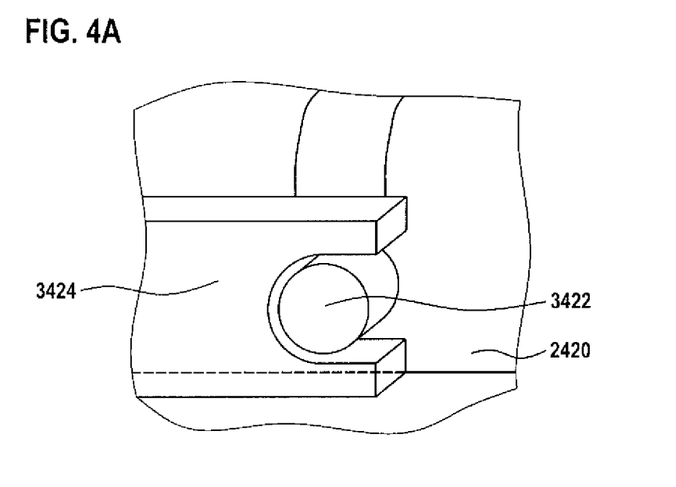
FIGS. 4A and 4B are simplified pseudo-3D representations of an arm with a mechanical hinge joint, the arm being of a backscattered electron detector module according to embodiments described herein.
Figure 4B:
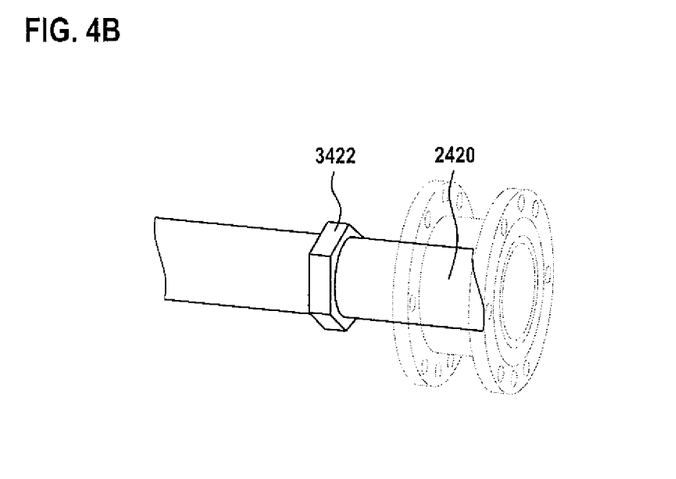

FIGS. 4A and 4B are simplified pseudo-3D representations of an arm, a hinge joint according to embodiments described herein.

According to embodiments, the hinge joint pin 3422 and/or hinge joint slot 3424 may form a hinge joint. The hinge joint slot 3424 may be in a U-shaped slot. The hinge joint slot 3424 may be suitable to provide a reaction force to the hinge joint pin 3422. The hinge joint slot may be arranged on the bearing module 3260. The hinge joint pin 3422 may be arranged on the arm 2420. The hinge joint pin 3422 may be a plurality of pins, for example two pins, and/or arranged on diametrically opposite sides of the arm 2420. Similarly, the hinge joint slot 3424 may be a plurality of slots, for example, two slots, and/or separated by a distance at least equal to the diameter or critical dimension, or a cross-sectional side of the arm 2420. The hinge joint pin 3422 may include a connecting angular or polygonal ring on the arm 2420. The angular or polygonal ring may be suitable as a guide, an assembling guide, and/or complementary face for the hinge joint slot 3424.

Figure 5A:
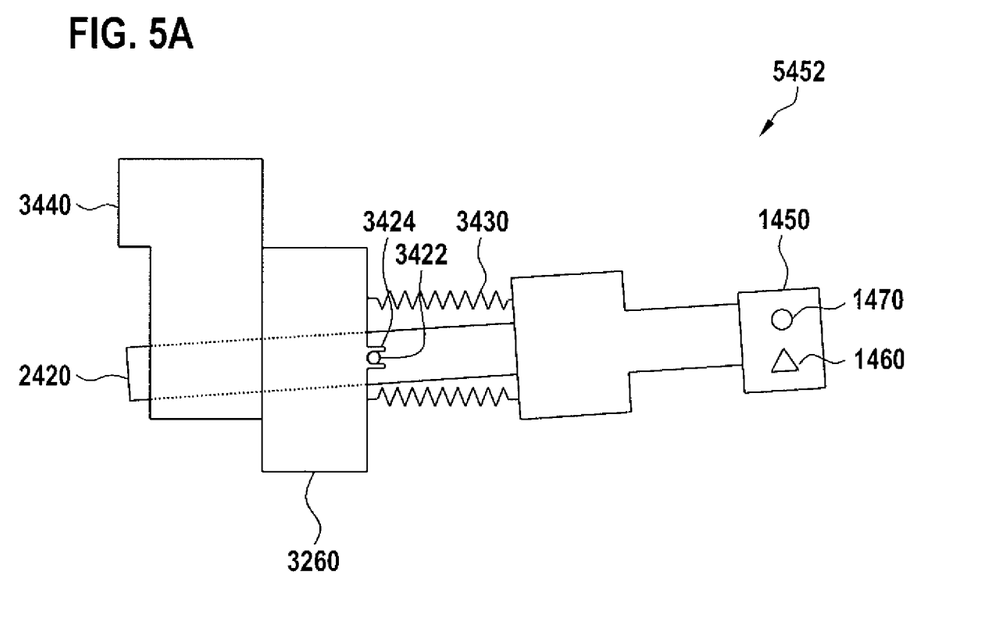
FIGS. 5A and 5B are simplified side view schematics of the backscattered electron detector module in a first angular position and second angular position according to embodiments described herein.
Figure 5B:
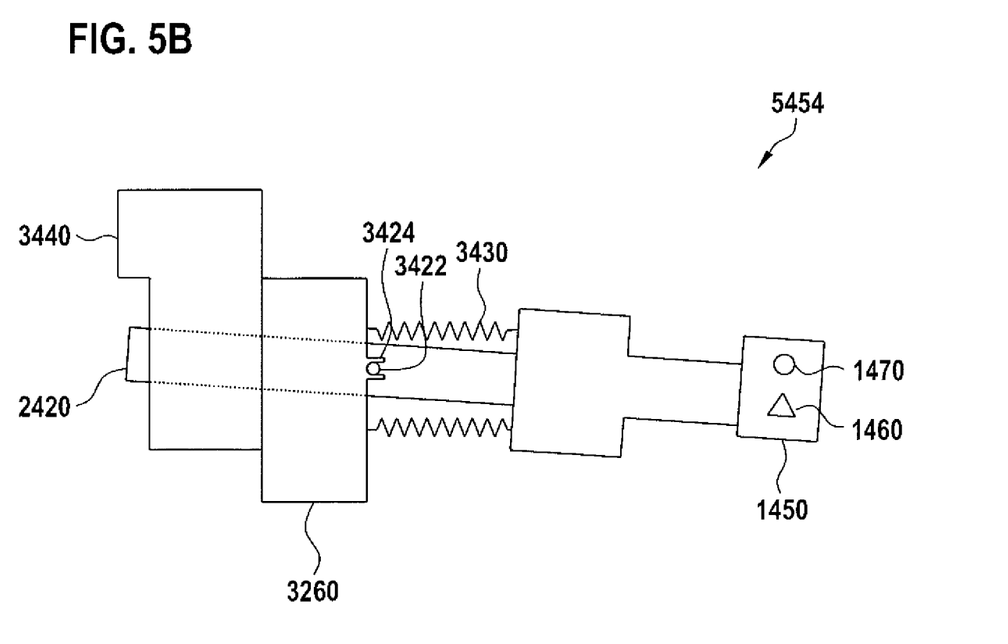

FIGS. 5A and 5B are simplified side view schematics of the backscattered electron detector module in a first angular position and second angular position according to embodiments described herein. According to embodiments, the backscattered electron detector module 1400 and/or the arm 2420 may be switchable, rotatable, tiltable, and/or moveable between a first angular position 5452 and a second angular position 5454. In the first angular position 5452, the aperture 1460 may be configured to be operational and/or the backscattered electron detector element 1470 to be non-operational. In the second angular position 5454, the backscattered electron detector element 1470 may be configured to be operational and/or the aperture 1460 to be non-operational. The first angular position 5452 may correspond to the arm 2420, and/or the backscattered electron detector actuator module 3440 at a first limit stop and/or a rotated-up-position/tilted-up-position. Similarly, the second angular position 5454 may correspond to the arm 2420, and/or the backscattered electron detector actuator module 3440 at a second limit stop and/or a rotated-down-position/tilted-down-position. The angular distance and/or separation between the first angular position 5452 and the second angular position 5454 may be at least 0 degrees and/or less than 10 degrees, preferably in a range from 2 to 5 degrees. The rotation may be about an axis. The rotation may be about the hinge joint pin 3422.

Figure 6A:
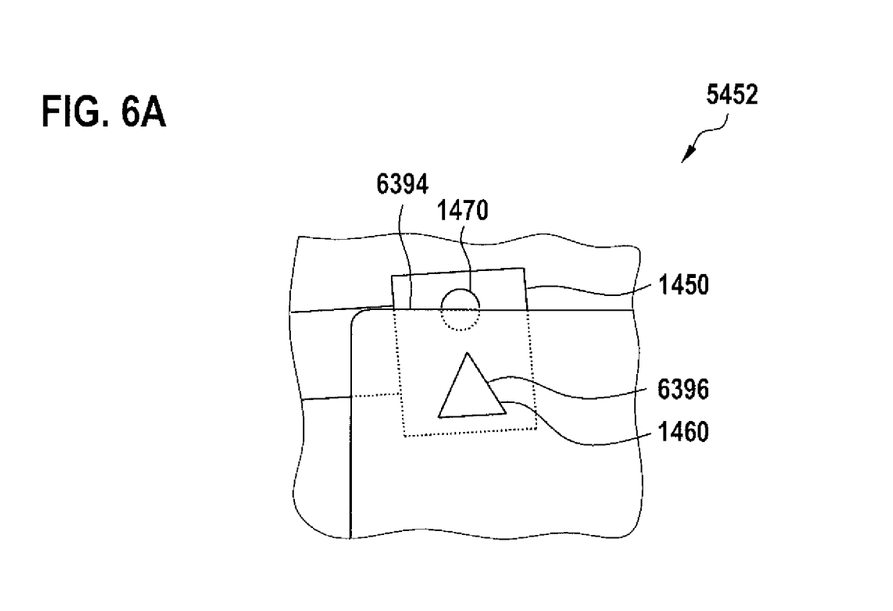
FIGS. 6A and 6B are close-up simplified side view schematics of the aperture and backscattered electron detector element of the backscattered electron detector module in a first angular position and second angular position according to embodiments described herein.
Figure 6B:
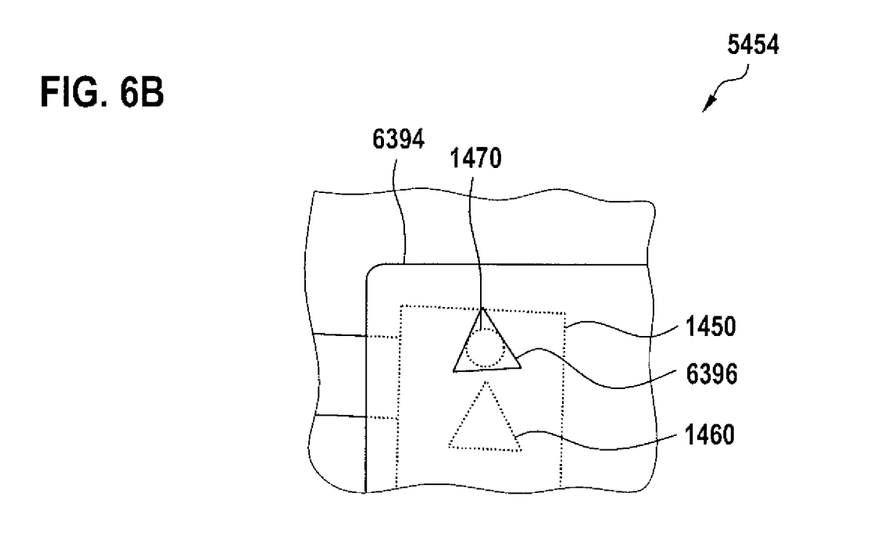

FIGS. 6A and 6B are close-up simplified side view schematics of the aperture and backscattered electron detector element of the backscattered electron detector module in a first angular position and second angular position according to embodiments described herein. According to embodiments, there may be a beam bender shield. In an example, the beam bender shield 6394 is a high-voltage shield. The beam bender shield 6394 may include a shield aperture 6396. The shield aperture 6396 may have a circular, square, triangular, or polygonal cross-section or shape. The shield aperture 6396 may have a similar or same cross-section as the aperture 1460 or the backscattered electron detector element 1470. In an example, the shield aperture 6396 and/or the aperture 1460 have a triangular shape, as shown in FIGS. 6A and 6B. In an example, the shield aperture 6396 and the aperture 1460 may be of the same size. In another example, at least one of the shield aperture 6396 and/or the aperture 1460 have a circular shape, while the other one has a triangular shape.

Aberrations can occur in the beam bender 1392, e.g. sector beam bender, which is used to deflect a signal charged particle beam 1102. For example, a hexapole component of the electric field can introduce 3-fold aberrations in the signal charged particle beam (e.g., secondary electron bundle) passing the sector beam bender 1392. With increasing width of the signal charged particle beam 1102 inside the sector beam bender 1392, an increasing amount of hexapole component deforms the signal charged particle beam 1102. An aperture, such as the shield aperture 6396 or the aperture 1460, having a substantially triangular shaped passage area for the signal charged particle beam 1102, such as a shape of an isosceles triangle, can reduce a hexapole component of a fringe field or reduce a hexapole aberration on the signal charged particle beam 1102. An aperture, such as the shield aperture 6396 or aperture 1460, having a substantially circular shaped passage area for the signal charged particle beam 1102, such as in a shape of a circle, can reduce or minimize unwanted influence of deflection fields, e.g. from the sector beam bender 1392.

In a preferred embodiment, which can be combined with other embodiments described herein, the shield aperture 6396 may be upstream of the aperture 1460. The shield aperture 6396 may be triangularly shaped. The aperture 1460 may be circularly shaped. Alternatively, at least one of the shield aperture 6396 and/or the aperture 1460, being positioned at a downstream side of the beam bender 1392, may have two sides, a first side facing the beam bender 1392 being substantially circularly shaped and a second side facing away from the beam bender 1392 being substantially triangularly shaped.

In some embodiments, the shield aperture 6396 may be upstream of the aperture 1460. The shield aperture 6396 may have a substantially triangular shaped passage area for the signal charged particle beam. Accordingly, the triangular shape of shield aperture 6396 may minimise a hexapole component of an electric fringe field. The aperture 1460 may be downstream of the shield aperture 6396. The aperture 1460 may have a substantially circular shaped passage area for the signal charged particle beam 1102. The circular shape of the aperture 1460 may minimise an influence of the electric fringe field on the signal charged particle beam 1102. Alternatively, the aperture 1460 may have a substantially triangular shape passage area for minimizing an influence of the hexapole component of the electric fringe field on the signal charged particle beam 1102. Alternatively, or in addition, the shield aperture 6396 may have a substantially circular shaped passage area for the signal charged particle beam 1102. The circular shape of the shield aperture 6396 may minimise an influence of the electric fringe field on the signal charged particle beam 1102. In a preferred embodiment, which can be combined with other embodiments described herein, the aperture 1460 has a substantially triangular shape, the shield aperture 6396 has a substantially triangular shape, and the backscattered electron detector element 1470 has a substantially circular shape.

In another example, the backscattered electron detector element 1470 has a circular shape of a diameter the same as, smaller than or larger than a dimension or altitude of the aperture 1460 or the shield aperture 6396. The first angular position 5452 may correspond to the operation of the aperture 1460 or to a secondary electron detection mode. The second position 5454 may correspond to the operation of the backscattered electron detector element 1470, or to a backscattered electron detection mode. The first angular position 5452 and second angular position 5454 are understood as one of the two possible order of the angular positions, with the reverse order equally possible, with corresponding reversal of the relevant elements, components, operations and effects.

Figure 7:
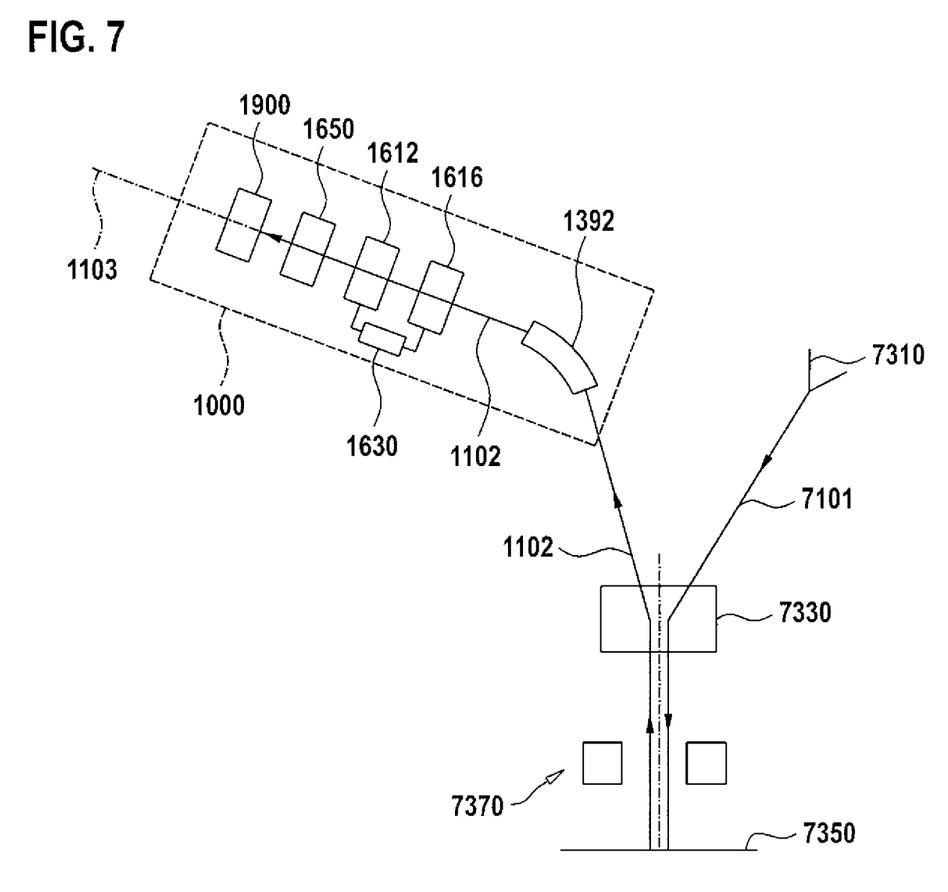
FIG. 7 is a simplified side view schematic of a charged particle beam device according to embodiments described herein.

FIG. 7 shows a simplified side view schematic of a charged particle beam device according to embodiments described herein. In an example, the charged particle beam device may be a scanning electron microscope. In a further example, the charged particle beam device may be a multi-beam device. The charged particle beam device may include a charged particle beam emitter, a beam separator, and/or an objective lens.

According to embodiments, the beam emitter 7310 is for emitting a primary charged particle beam 7101. The beam emitter 7310 may e.g. be an electron gun. The charged particle beam device may include an objective lens 7370 for focusing the primary charged particle beam 7101 onto a sample 7350. The charged particle beam device may include a beam separator 7330 for separating the primary charged particle beam 7101 from a signal charged particle beam 1102 emanating from the sample 7350. The charged particle beam device may include a secondary charged particle imaging system according to embodiments described herein. With respect to the propagation of the signal charged particle beam 1102, the secondary charged particle imaging system may be arranged downstream of the beam separator 7330.

As shown in FIG. 7, the primary charged particle beam 7101 emitted from the beam emitter 7310 may travel from the beam emitter 7310 to the beam separator 7330. As further shown, the primary charged particle beam 7101 may be deflected in the beam separator 7330. As further shown, the primary charged particle beam 7101 may travel from the beam separator 7330 to the objective lens 7370 adapted for focusing the primary charged particle beam 7101 onto the sample 7350. According to the exemplary embodiment illustrated in FIG. 7, the primary charged particle beam 7101, when traveling from the beam separator 7330 to the sample 7350 via the objective lens 7370, travels along the optical axis defined by the objective lens 7370. Upon impingement of the primary charged particle beam 7101 on the sample 7350, the signal charged particle beam 1102 is generated. As shown in FIG. 7, the signal charged particle beam 1102 may travel from the sample 7350 to the beam separator 7330, wherein the signal charged particle beam 1102 may travel in the opposite direction of the primary charged particle beam 7101. The beam separator 7330 acts on the primary charged particle beam 7101 and on the signal charged particle beam 1102 and is adapted for separating the primary charged particle beam 7101 from the signal charged particle beam 1102. As shown, the signal charged particle beam 1102 may be deflected in the beam separator 7330. The deflection may be such that the signal charged particle beam leaving the beam separator is directed away from the primary charged particle beam 7101. The signal charged particle beam 1102 travels from the beam separator 7330 to the secondary charged particle imaging system.

The beam separator 7330 may include a magnetic beam separation portion, e.g. including one or more coils, adapted for generating a magnetic field. Additionally, or alternatively, the beam separator 7330 may include an electrostatic beam separation portion, e.g. including one or more electrodes, adapted for generating an electric field. The electric field and/or magnetic field may act on the primary charged particle beam 7101 and/or on the signal charged particle beam 1102 passing through the beam separator 7330. Under the influence of the magnetic field and/or of the electric field, the primary charged particle beam 7101 and the signal charged particle beam 1102 may be deflected in the beam separator 7330.

The charged particle beam device may further include at least one of the following: a stage, wherein the stage may be movable with respect to the objective lens 7370 for varying the working distance; a sample voltage source adapted for varying the landing energy of the primary charged particle beam 7101; one or more proxi electrodes adapted for varying the strength of the extraction field acting on the signal charged particle beam 1102; a magnetic objective lens portion included in the objective lens 7370 adapted for generating a magnetic field. As further described above, under the action of the controller 1630, the signal charged particle beam 1102 may be mapped onto the aperture plate 1650, e.g. in the topography detection mode or in the bright field detection mode, independent of a variation of the at least one first operating parameter and/or independent of a variation of the at least one second operating parameter.

The charged particle beam device shown in FIG. 7 includes the secondary charged particle imaging system according to embodiments described herein. The secondary charged particle imaging system shown in FIG. 7 includes the beam bender 1392, as discussed above. As further discussed above, the signal charged particle beam 1102 is directed away from the primary charged particle beam 7101 by the beam separator 7330. The beam bender 1392 may direct the signal charged particle beam 1102 further away from the primary charged particle beam 7101, as illustrated in FIG. 7.

Figure 8:
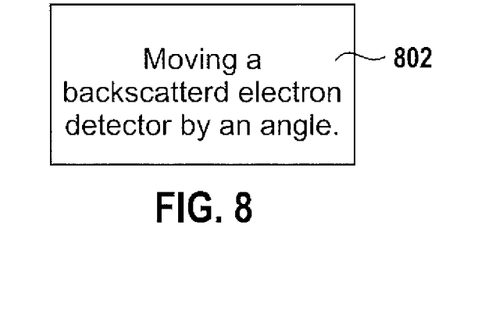
FIG. 8 is a method diagram for operating a secondary charged particle imaging system according to embodiments described herein.

FIG. 8 is a method diagram for operating a secondary charged particle imaging system according to embodiments described herein. According to one embodiment, a method of operating a secondary charged particle imaging system is provided. The method includes rotating a backscattered electron detector module between a first angular position 5452 and a second angular position 5454 about an axis, as for example illustrated in operation 802. In embodiments, a first operational mode and a second operational mode can be provided by rotating the backscattered electron detector module 1400. In the first operational mode, signal electrons or the signal charged particle beam 1102 may pass through the backscattered electron detector module 1400. In the second operational mode, signal electrons or the signal charged particle beam 1102 may impinge on the backscattered electron detector element 1470 of the backscattered electron detector module 1400.

At least one of the following advantages may be realised by embodiments described herein. The backscattered electron detector can be moved in and out of the optical axis. When the backscattered electron detector is moved out of the optical axis, the conventional secondary electron detector with secondary electron optics can be used. By placing the backscattered electron detector before the secondary electron optics, efficiency, in particular detection efficiency is improved, for example, up to 30%, depending on the landing energies involved. Efficiency of the backscattered electron detection is comparable to a single beam system without secondary electron optics. Another advantage is that a multi-beam system may be combined with backscattered electron detection capability. On-axial backscattered electron detection can be provided for in single beam mode, for multi-beam systems or single-beam systems with secondary electron optics. Secondary electron optics are particularly advantageous for multi-beam systems. On-axial secondary electrons and backscattered electrons can be detected in one column with a simple mechanical switching. Multi-beam columns can be used for detecting defects using backscattered electron detection. A particular advantage is that multi-beam columns can be used in single-beam mode, secondary electron detection mode as well as backscattered electron detection mode in a simple manner. Another particular advantage is that the tilting or rotating motion concept allows for the minimum space requirement inside, and especially outside the column. Minimal space is needed outside of column and inside the housing. Much less space is needed in the tilting or rotating concept as compared to a linear actuation motion. A further advantage is that by positioning the detector after the beam bender detection efficiency and accessibility are both optimised. Space near the primary beam may be particularly tight. Yet another advantage is that at the point after the beam bender, the electron beam can have the smallest cross-section. A small cross-section allows for good detection efficiency. Furthermore, the moving parts are outside of the vacuum containment and contamination is avoided. This concept can be advantageous for electron beam inspection and electron beam mask inspection.

The invention claimed is:

1. A secondary charged particle imaging system, comprising:
    a backscattered electron detector module configured to collect and/or detect backscattered electrons of a signal charged particle beam, the backscattered electron detector module including a backscattered electron detector element; and
    a secondary charged particle optics module configured to shape, focus, and/or defocus the signal charged particle beam;
    wherein the backscattered electron detector module is arranged along an optical axis upstream of the secondary charged particle optics module, and
    wherein the backscattered electron detector module is rotatable between a first angular position where the signal charged particle beam can pass the backscattered electron detector module and a second angular position where the backscattered electron detector element is aligned with the optical axis.

2. The secondary charged particle imaging system according to claim 1, wherein the backscattered electron detector module comprises an aperture.

3. The secondary charged particle imaging system according to claim 2, wherein the aperture is arranged on the optical axis of the signal charged particle beam in the first angular position.

4. The secondary charged particle imaging system according to claim 2, wherein the aperture is arranged between a beam bender and the secondary charged particle optics module in the first angular position.

5. The secondary charged particle imaging system according to claim 2, wherein the aperture is configured to allow the signal charged particle beam to pass through the aperture in the first angular position.

6. The secondary charged particle imaging system according to claim 1, further comprising a beam bender.

7. The secondary charged particle imaging system according to claim 6, wherein the backscattered electron detector element is arranged between the beam bender and the secondary charged particle optics module in the second angular position.

8. The secondary charged particle imaging system according to claim 1, wherein the secondary charged particle imaging system is configured for detecting secondary electrons in the first angular position.

9. The secondary charged particle imaging system according to claim 1, wherein the backscattered electron detector element is configured to collect backscattered electrons of the signal charged particle beam in the second angular position.

10. The secondary charged particle imaging system according to claim 1, wherein the secondary charged particle imaging system is configured for detecting backscattered electron in the second angular position.

11. The secondary charged particle imaging system according to claim 1, wherein the backscattered electron detector element is arranged at a point of smallest cross-section or adjacent to the point of smallest cross-section of the signal charged particle beam in the second angular position.

12. The secondary charged particle imaging system according to claim 1, further comprising a backscattered electron detector actuator module.

13. The secondary charged particle imaging system according to claim 12, wherein the backscattered electron detector actuator module comprises a first limit stop and a second limit stop.

14. The secondary charged particle imaging system according to claim 13, wherein the backscattered electron detector module is at the first angular position at the first limit stop, and wherein the backscattered electron detector module is at the second angular position at the second limit stop.

15. The secondary charged particle imaging system according to claim 12, wherein the backscattered electron detector actuator module is configured for rotating the backscattered electron detector module between the first angular position and the second angular position.

16. The secondary charged particle imaging system according to claim 1, wherein the backscattered electron module comprises an arm, and wherein the arm comprises a hinge joint pin at an axis.

17. The secondary charged particle imaging system according to claim 1, further comprising a flexible enclosure.

18. The secondary charged particle imaging system according to claim 17, wherein the backscattered electron module comprises an arm having a hinge joint pin at an axis, and the flexible enclosure is hermetically coupled at a first end portion to the arm between the hinge joint pin and the backscattered electron detector element.

19. The secondary charged particle imaging system according to claim 17, wherein the flexible enclosure is hermetically coupled at a second end portion to a housing.

20. The secondary charged particle imaging system according to claim 17, wherein the flexible enclosure is a flexible hose or bellow.

21. The secondary charged particle imaging system according to claim 17, wherein the flexible enclosure is configured to maintain the backscattered electron detector element in vacuum condition and a hinge joint of an arm in ambient condition.

22. The secondary charged particle imaging system according to claim 1, wherein an angular separation of the first angular position and the second angular position is less than 10 degrees.

23. A charged particle beam device comprising the secondary charged particle imaging system according to claim 1.

24. The charged particle beam device according to claim 23, wherein the charged particle beam device is a multi-beam charged particle beam device.

25. A method of operating a secondary charged particle imaging system comprising:
receiving a signal charged particle beam at a backscattered electron detector module, wherein the backscattered electron detector module is in a first angular position; and
rotating the backscattered electron detector module between the first angular position and a second angular position about an axis, wherein in the second angular position a backscattered electron detector element of the backscattered electron detector module is aligned with the signal charged particle beam to detect backscattered electrons in the signal charged particle beam;
wherein in the first angular position, the signal charged particle beam passes the backscattered electron detector module to a secondary charged particle optics module, and in the second angular position, the signal charged particle beam does not pass the backscattered electron detector module to the secondary charged particle optics module.

* * * * *